US012681082B2

(12) United States Patent
Wang et al.

(10) Patent No.: US 12,681,082 B2
(45) Date of Patent: Jul. 14, 2026

(54) ELECTRONIC DEVICE

(71) Applicant: Infineon Technologies AG, Neubiberg (DE)

(72) Inventors: Wei Wang, Munich (DE); Michael Augustin, Villach (AT); Jürgen Schäfer, Oberhaching (DE); Henning Behrmann, Freising (DE); Jörg Schreiner, Fürstenfeldbruck (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/939,967

(22) Filed: Nov. 7, 2024

(65) Prior Publication Data

US 2025/0147102 A1    May 8, 2025

(30) Foreign Application Priority Data

Nov. 8, 2023    (DE) ..................... 10 2023 130 908.0

(51) Int. Cl.
G01R 31/317        (2006.01)

(52) U.S. Cl.
CPC . G01R 31/31725 (2013.01); G01R 31/31703 (2013.01)

(58) Field of Classification Search
CPC ........ G01R 31/31725; G01R 31/31703; G01R 31/54; G01R 31/52; H03K 5/19; G06F 11/0739; G06F 11/076
See application file for complete search history.

(56) References Cited

U.S. PATENT DOCUMENTS

| | | | |
|---|---|---|---|
| 7,996,162 B1 | 8/2011 | Zhang et al. | |
| 2006/0190767 A1 | 8/2006 | Nair | |
| 2021/0174758 A1* | 6/2021 | Liu | ........................... G06F 1/06 |
| 2024/0204657 A1* | 6/2024 | Chen | ................... H02M 1/0054 |

FOREIGN PATENT DOCUMENTS

| | | |
|---|---|---|
| CN | 113296998 A | 8/2021 |
| JP | H1021111 A | 1/1998 |

* cited by examiner

*Primary Examiner* — Thien Nguyen
(74) *Attorney, Agent, or Firm* — Eschweiler & Potashnik, LLC

(57)        ABSTRACT

According to some embodiments, an electronic device is described, having a counter circuit which is configured to detect first pulses in a received first output signal and to determine a number of the detected first pulses, a counter circuit which is configured to detect second pulses in a received second output signal and to determine a number of the detected second pulses, and an error detection circuit configured to register a first difference between the number of first pulses detected in a first time interval and the number of second pulses detected in the first time interval, determine a second difference between the number of first pulses detected in a second time interval and the number of second pulses detected in the second time interval and indicate an error if the first difference and the second difference differ from one another by at least one predefined threshold value.

19 Claims, 7 Drawing Sheets

FIG 7

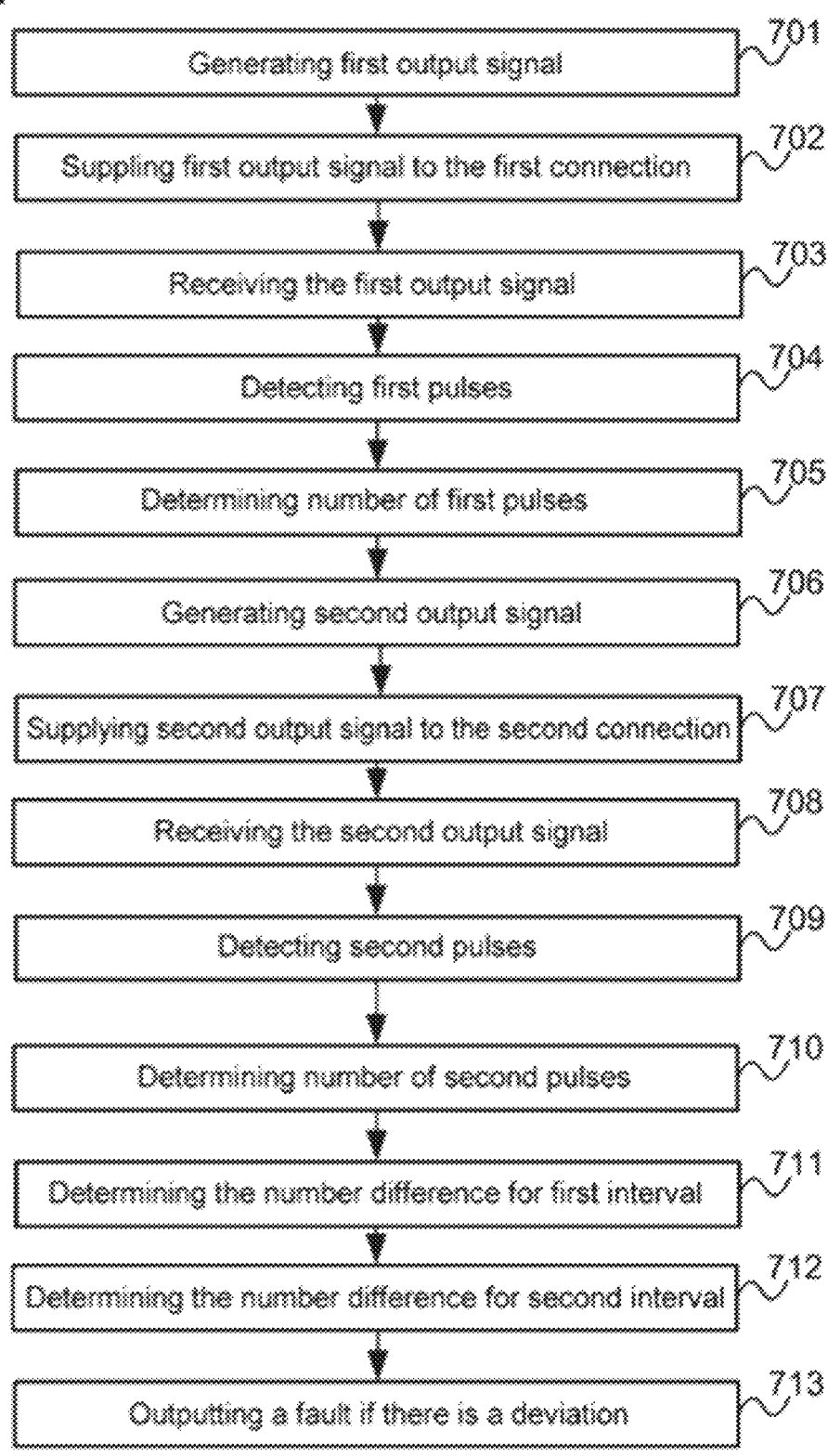

| | |
|---|---|
| Generating first output signal | 701 |
| Suppling first output signal to the first connection | 702 |
| Receiving the first output signal | 703 |
| Detecting first pulses | 704 |
| Determining number of first pulses | 705 |
| Generating second output signal | 706 |
| Supplying second output signal to the second connection | 707 |
| Receiving the second output signal | 708 |
| Detecting second pulses | 709 |
| Determining number of second pulses | 710 |
| Determining the number difference for first interval | 711 |
| Determining the number difference for second interval | 712 |
| Outputting a fault if there is a deviation | 713 |

ELECTRONIC DEVICE

REFERENCE TO RELATED APPLICATIONS

This application claims priority to German Patent Application 10 2023 130 908.0, filed on Nov. 8, 2023, the contents of which are hereby incorporated by reference in their entirety.

TECHNICAL FIELD

Exemplary embodiments relate generally to electronic devices.

BACKGROUND

Electronic devices may have high demands on their reliability depending on the location of use. Thus, for example, an electronic control unit in a motor vehicle generally has to meet a high safety standard (such as ASIL (automotive safety integrity level) D). This includes, in particular, the robustness against errors in the connections of different components, such as, for example, the connection to a controlled device or another communication partner. While high reliability can be achieved by various approaches, for example by providing redundant elements, in particular redundant output terminals (pins), these approaches increase the complexity and thus, for example, the required chip area, the power consumption and thus the costs. Accordingly, efficient approaches for detecting faults in the operation of electronic devices, in particular in the case of connections between two electronic devices, are desirable.

SUMMARY

According to some embodiments, an electronic device includes a signal generation circuit, a counter circuit, and a fault detection circuit. The signal generation circuit is configured to generate a first output signal by adding a pulse signal to a first useful signal and to supply it to a first output terminal of the electronic device and to generate a second output signal by adding the pulse signal to a second useful signal and to supply it to a second output terminal of the electronic device. The counter circuit is configured to receive the first output signal from the first output terminal, detect first pulses in the received first output signal, and determine a number of the detected first pulses and receive the second output signal from the second output terminal, detect second pulses in the received second output signal and determine and determine a number of the detected second pulses. The fault detection circuit is configured to register a first difference between the number of first pulses detected in a first time interval and the number of second pulses detected in the first time interval, determine a second difference between the number of first pulses detected in a second time interval and the number of second pulses detected in the second time interval, and indicate an error if the first difference and the second difference differ from one another by at least one predefined threshold value.

BRIEF DESCRIPTION OF THE DRAWINGS

The figures do not reflect the actual proportions but are intended to be used to illustrate the principles of the various exemplary embodiments. Various exemplary embodiments are described below with reference to the following figures.

FIG. 7 shows a flowchart illustrating a method for detecting faults at output terminals of an electronic device.

DETAILED DESCRIPTION

The following detailed description refers to the accompanying figures, which show details and exemplary embodiments. These exemplary embodiments are described in such detail that a person skilled in the art can carry out the invention. Other embodiments are also possible and the exemplary embodiments can be changed in structural, logical and electrical terms without departing from the subject matter of the invention. The various exemplary embodiments are not necessarily mutually exclusive; rather, various embodiments can be combined with one another to produce new embodiments. In the context of this description, the terms "connected", "attached" and "coupled" are used to describe both a direct and an indirect connection, a direct or indirect attachment and a direct or indirect coupling.

Figure 1:
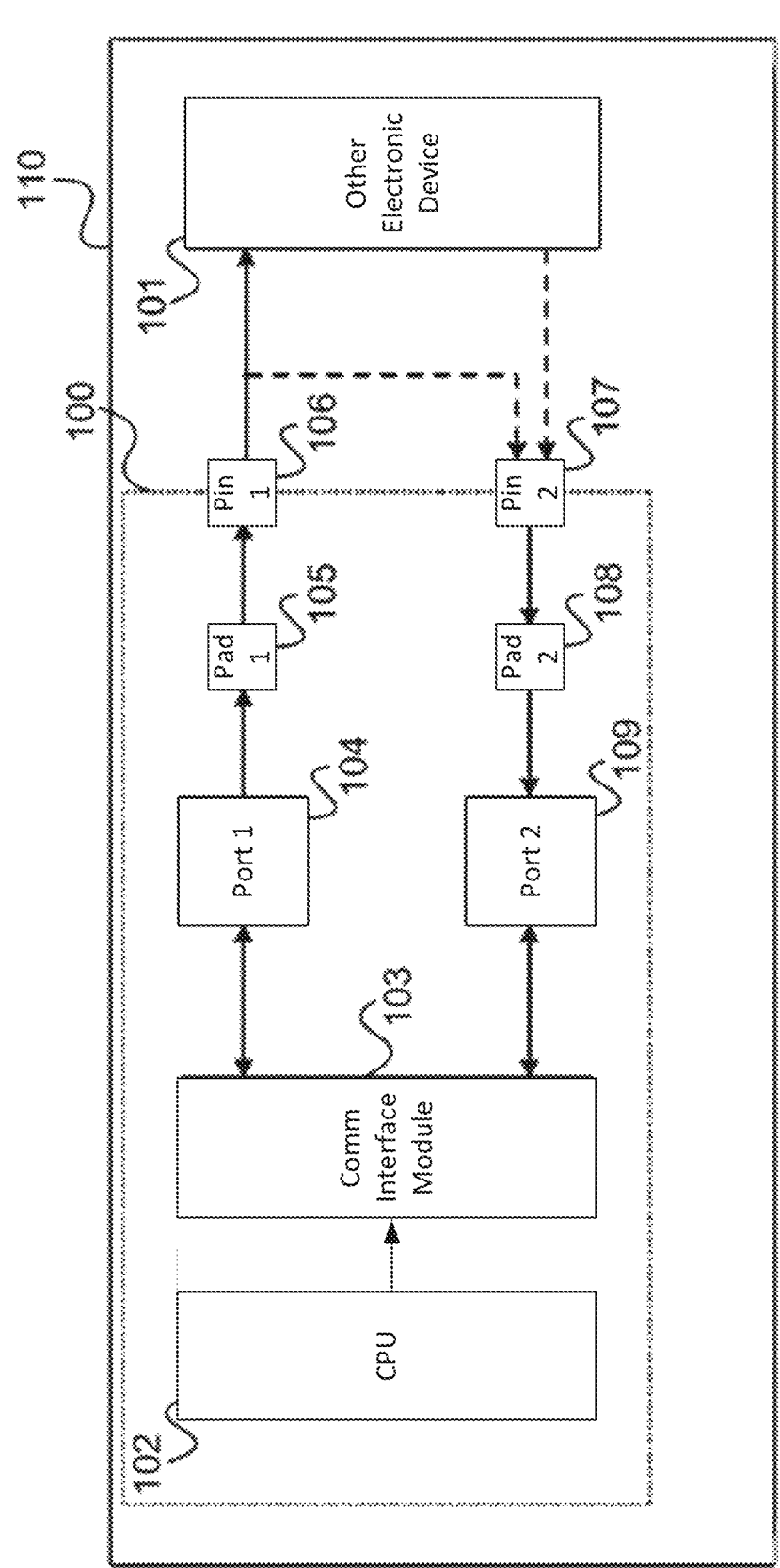
FIG. 1 shows an electronic device.

FIG. 1 shows an electronic device 100.

The electronic device 100 is, for example, an electronic control unit (ECU), in particular for a vehicle, but may also be a control unit or a data processing device for other devices such as machines, power generators, etc.

In the example shown in FIG. 1, the electronic device 100 communicates with another electronic device 101 (e.g., in the same device 110), e.g., an actuator in a vehicle. For this purpose, the electronic device 100 has, as a useful data source, a CPU (central processing unit) 102 and a communication interface module 103 (e.g. a bus chip, e.g. for supporting a peripheral bus). A useful data signal is output via a first port 104, a first pad 105 and a first pin 106 of the electronic device 100 to the other electronic device 101, which is connected to the first pin 106.

In order to comply with a safety standard such as ASIL-B, it is sufficient for the electronic device 101 to internally check the useful data signal which it supplies to the first pin 106. Consequently, only one pin is required for the output of a useful data signal, but no pin errors, for example a break in the connection to the other electronic device 101 or a short circuit (or at least one connection) of the pin to a supply potential (high supply potential or ground), can thus be detected.

Since it is possible to demand according to a stricter safety standard, such as ASIL-D, for example, that such pin errors are also detectable, it is possible to provide a second pin 107 which receives feedback of the output useful signal from a point of the connection between pin and other electronic device 101 or the electronic device 101 itself. This feedback may then be provided to the communication interface module 103 for detecting pin errors via a second pad 108 and a second port 109. Pin errors are thus detectable, but the complexity (and thus the area requirement, production costs etc.) increases on account of the required return path, in particular the second pin 107.

Therefore, according to various embodiments, a procedure is provided which makes it possible to detect pin errors with a single pin. The pin errors are, for example an interrupted connecting line (at the pin). This leads to a decrease in the capacitance at the pin and/or an increase in the impedance at the pin (from the point of view of the electronic device whose pin is it). These effects can be used for detection; and/or a short circuit (or at least one connection to a certain resistance) of the pin to the (high) supply potential or to ground (i.e. the low supply potential). Depending on this, the steepness of decreasing or rising edges of the output useful signal decreases or increases as a result. This effect can also be used for detection.

The useful signal that is output is, for example:

a bus signal, such as an ASCLIN signal, a QSPI signal, an I2C signal, a SENS signal, or a PSI5 signal, for example;

a (possibly critical) enable signal; and/or a PWM (pulse width modulation) signal or PWM (pulse density modulation) signal It should be noted that two or even more useful signals have to be output for at least some interfaces that transmit such signals. For example, in a PWM controller, three useful signals (one per phase) are often output. It is therefore assumed in the following exemplary embodiments that the respective electronic device has a plurality of (output) channels and thus also a plurality of pins. However, only one pin is required per output channel in order to detect pin errors, in contrast to the example of FIG. 1, where two pins are provided for a single output channel in order to be able to detect pin errors of the output channel.

Figure 2:
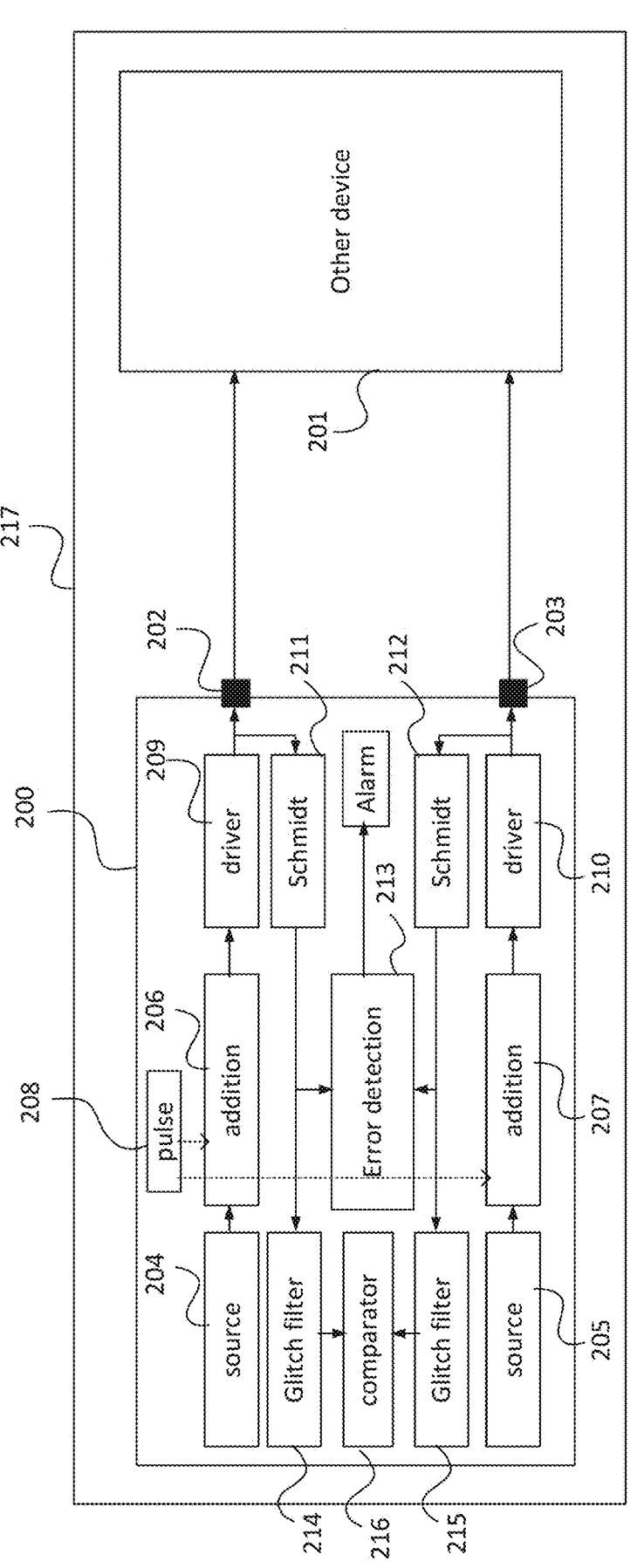
FIG. 2 shows an electronic device according to one embodiment.

FIG. 2 shows an electronic device 200 according to one embodiment.

As in the example of FIG. 1, the electronic device 200 is connected to another electronic device 201 (e.g. in the same device 217), but in contrast to FIG. 1, two output channels are realized: a first output channel, which is realized by means of a first pin 202, and a second output channel, which is realized by means of a second pin 203. For example, in some cases the electronic device 200 and the other electronic device 201 may be separate packaged chips that are connected by a bus that manifests as conductive traces on a printed circuit board, but in other cases the electronic device 200 and the other electronic device 201 can be separate die that are stacked over one another or laterally next to one another within a multi-die chip, whereby these die are connected to one another using bond pads, through substrate vias, or solder bumps that directly couple electronic device 200 and the other electronic device 201.

For each output channel, a respective signal source 204, 205 (which, however, can also be realized by a common circuit or circuit arrangement, such as, for example, a CPU and a communication interface module as in the example of FIG. 1) generates a respective useful signal. A pulse signal (generated by a signal generator (for example pulse generator) 208) is added to the useful signal by a respective addition circuit (or "combination circuit") 206, 207 (which in turn can be realized by a common circuit which operates, for example, in time division multiplex) to each of the two useful signals. A respective output driver circuit 209, 210 then supplies the respective output signal generated in this way to the respective pin 202, 203 for each output channel.

The pulse signal added to the useful signals is a "high-frequency pulse signal compared to the "low-frequency useful signals", i.e. the pulse length of the pulses of the pulse signal is only a fraction of the pulse length of the pulses of the useful signals. By way of example, the pulse length of the pulse signal is 2.5 ns to 12.5 ns, while the pulse length of the useful signal is 250 ns, for example (that is to say the pulse length of the high-frequency pulse signal is 20 times smaller than that of the useful signal (or else at least 10 times smaller, 5 times smaller, 30 times smaller, etc.).

In order to detect pin errors, a respective Schmitt trigger 211, 212 is then read out the respective output signal at the respective pin 202, 203 for each pin 202, 203 by means of a respective feedback circuit of the electronic device 200, in this embodiment. The signals output by the Schmitt triggers 211, 212 are referred to as received (or fed back) output signals. These include pulses corresponding to those of the (high-frequency) pulse signal added to the useful signals (i.e., injected pulses included at the locations in the received output signals where they were injected into the output signals). Which pulses contain the received output signals depends on various properties, in particular the states of the pins 202, 203 (including the connecting lines connected thereto), but also other environmental properties such as a state of a board on which the electronic device 200 and the other electronic device 201 are arranged, such as, for example, temperature and the (exact) level of the supply voltage, since the pulse shape of the pulses (in particular pulse length and pulse strength) differs depending on the different properties and ambient conditions, pulses are therefore filtered out by the Schmitt triggers 211, 212.

Therefore, since properties other than the state of the pins (such as temperature and level of the supply voltage) can also change, according to various embodiments, the number of (high-frequency) pulses of a received output signal is not used to detect pin errors, but the number of pulses between the channels is compared. This number does not need to be the same for both channels, but if the difference between the number of (high-frequency) pulses of the first channel and the number of (high-frequency) pulses of the second channel changes, this is assessed as an indication that there is a pin error (for one of the channels). If, for example, the output impedance (or also the capacitance) changes at one of the pins, but not at the other, this is reflected in a change in the difference in pulse numbers (if the change in impedance or capacitance is high enough). In other words, detection is carried out on the basis of the relative number of output channels, not on the basis of the absolute number of a respective output channel.

If more than two channels are present, it is also possible, on the basis of which two (or more) channels the difference has remained the same, to determine for which of the channels a pin error is present (for example on the basis of a majority decision).

In order to detect a pin error, an error detection circuit 213 therefore counts the pulses in the received output signals (e.g. the rising and falling edges in each case), for example by means of a respective counter circuit, and initially registers (e.g. in a first time interval) the difference between the number of pulses of the first and second output channels (for example per predefined interval length, for example per useful signal cycle). At later time intervals (e.g. in a second time interval), the error detection circuit 213 again ascertains this difference. If the difference determined for the first time interval differs from the difference determined for the second time interval, the error detection circuit outputs an error signal which indicates a pin error.

It is also possible for the respective received output signal per output channel (possibly also filtered by a glitch filter 214, 215 in order to filter out the high-frequency pulses) to be compared with the respective useful signal by a comparator 216 in order to detect output errors.

Figure 3:
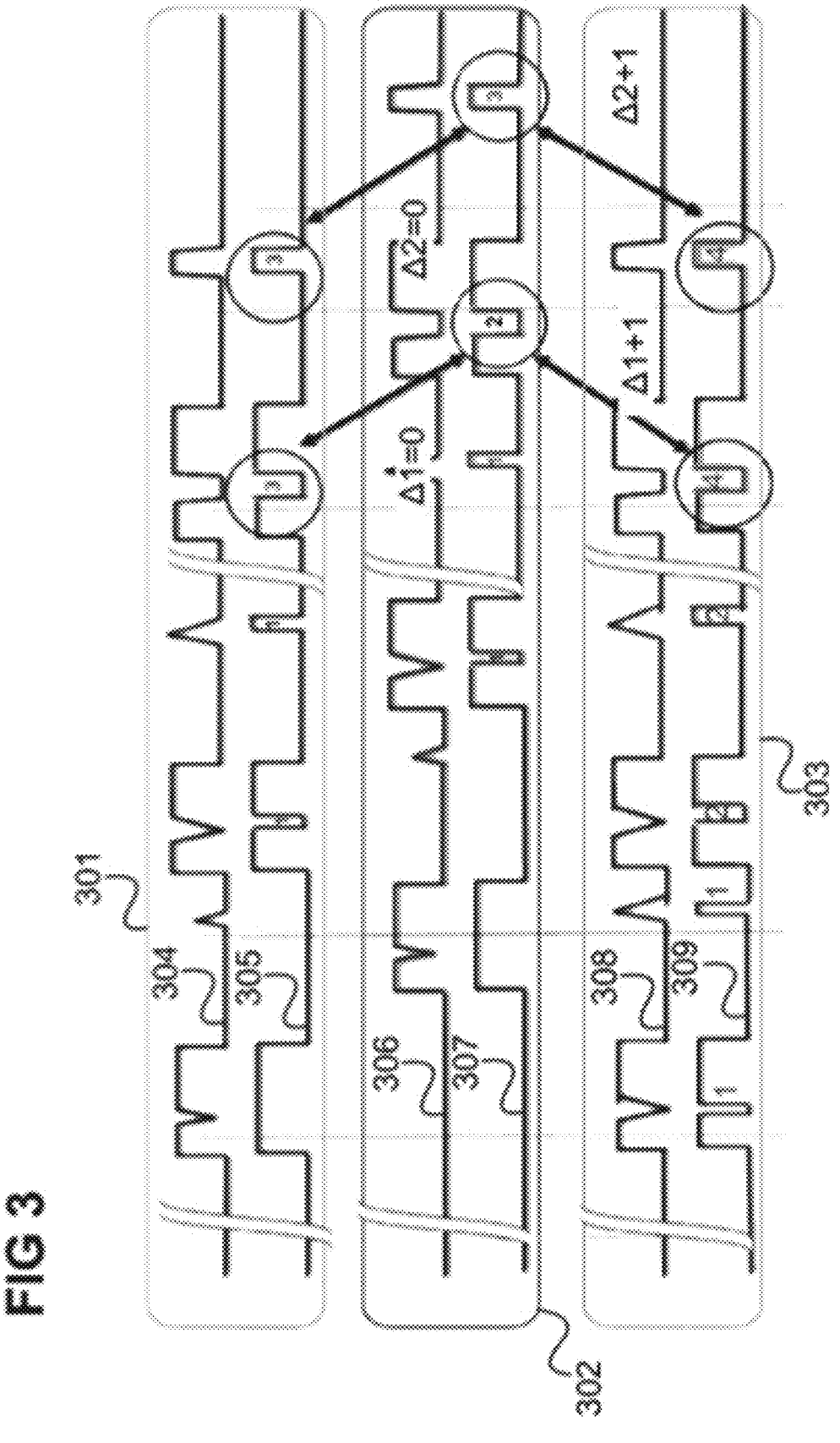
FIG. 3 shows an example of pin error detection.

FIG. 3 shows an example of pin error detection.

A first diagram 301 shows the output signal 304 and the received output signal 305 for the first output channel in the first time interval.

A second diagram 302 shows the output signal 306 and the received output signal 307 for the second output channel in the first time interval. For the sake of simplicity, it is assumed that the profiles of the output signal and the received output signal for the second output channel are the same in the second time interval (that is to say are also illustrated by the second diagram 302).

A third diagram 303 shows the output signal 308 and the received output signal 309 for the first output channel in the second time interval.

In the first time interval, the error detection circuit 213 registers the difference in the numbers of (high-frequency) pulses in the received output signal of the first channel and the second channel. In this embodiment, falling pulses (that is to say glitches downward, that is to say level dips (toward the low supply potential) of one or more (positive, that is to say toward the high supply potential) pulses of the useful signal) and rising pulses (that is to say glitches upward, that is to say level deflections outside pulses of the useful signal) are counted separately, three in each case being present (for both the first and second channels). The difference ("delta") is thus equal to zero both for the falling pulses and for the rising pulses.

In the second time interval, however, the received output signal of the first channel contains in each case four rising and falling (high-frequency) pulses. The difference between the numbers is thus now in each case one. This is evaluated by the error detection circuit 213 as pin error.

Figure 4:
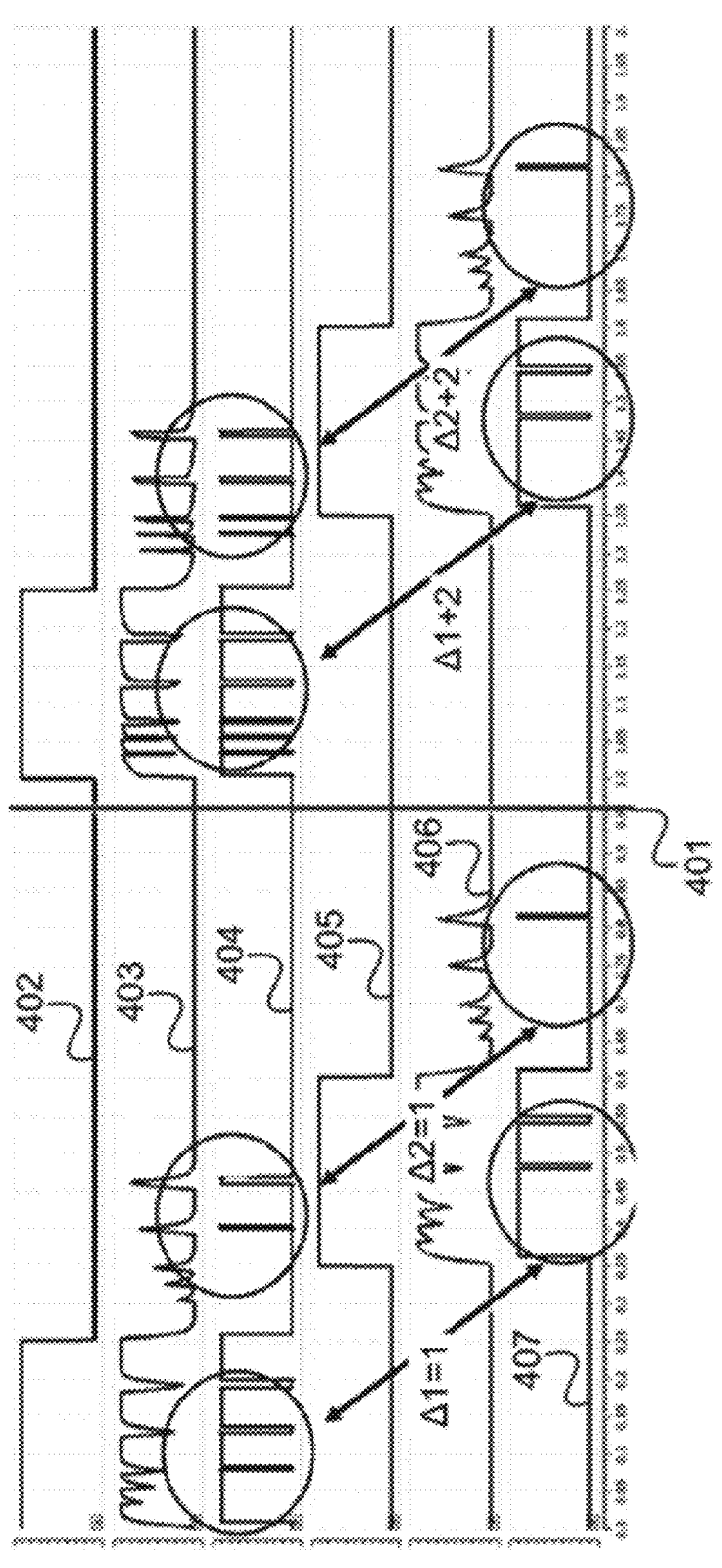
FIG. 4 shows a further example of pin error detection.

FIG. 4 shows an example of pin error detection, wherein the pin error is an impedance increase of 100Ω of the pin of the first output channel at a time 401.

In this example, the interval before time 401 is the first time interval and the interval after time 401 is the second time interval.

The following are shown:

the first useful signal 402 (i.e. the useful signal of the first channel);

the first output signal 403 (i.e. the output signal of the first channel);

the first received output signal 404 (i.e. the received output signal of the first channel);

the second useful signal 405 (i.e. the useful signal of the second channel);

the second output signal 406 (i.e. the output signal of the second channel); and the second received output signal 407 (i.e. the received output signal of the second channel).

In the first time interval, the error detection circuit 213 registers the difference in the numbers of (high-frequency) pulses in the received output signal of the first channel and the second channel. As in the example of FIG. 3 here, falling pulses (that is to say glitches downward) and rising pulses (that is to say glitches upward) are counted separately, wherein, in this example, three high-frequency falling pulses and two high-frequency rising pulses are counted for the first output channel, for the second output channel, however, two high-frequency falling pulses and one high-frequency rising pulse. The difference is thus in each case one.

In the second time interval, the received output signal of the channel for the first output channel contains five high-frequency falling pulses and four high-frequency rising pulses due to the increased impedance, while the pulse numbers for the second output channel remain the same. The difference between the numbers is thus in each case three (that is to say has increased by two). This is evaluated by the fault detection circuit 213 as an indication of a pin fault.

As mentioned above, the number of pulses can change not only in the case of pin errors, but is also dependent on ambient conditions, such as the board temperature, for example. However, the ambient conditions influence the number of pulses for all channels, such that the difference between the numbers remains the same. This is illustrated in FIG. 5.

Figure 5:
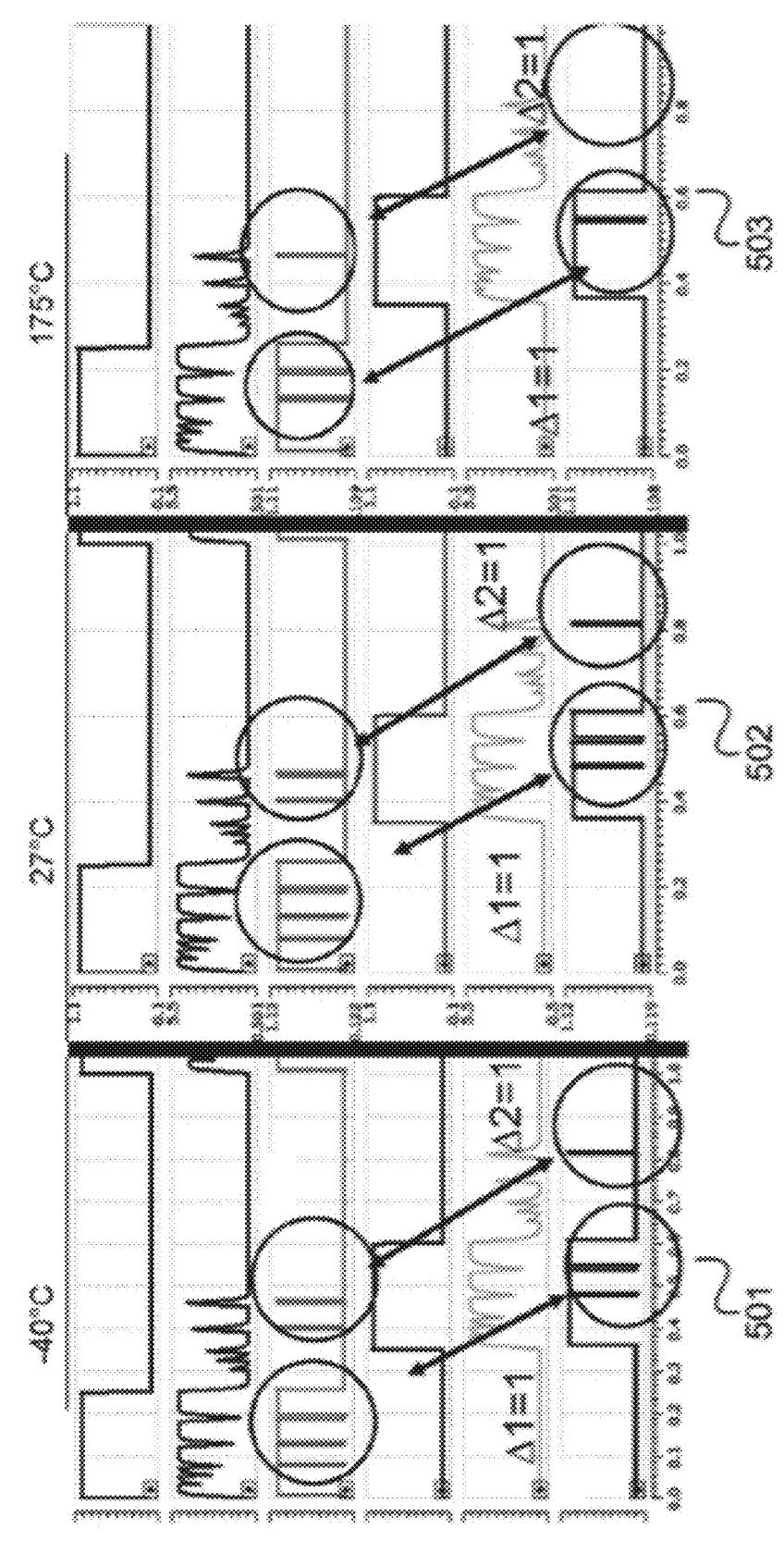
FIG. 5 illustrates the temperature dependence of pulse numbers.

FIG. 5 illustrates the temperature dependence of the pulse numbers.

In this example, the board temperature is −40° in a first time interval 501, the board temperature is 27° in a second time interval 502, and the board temperature is 175° in a third time interval 503. Analogueously to FIG. 4 each show the useful signal per output channel, the output signal per output channel and the received output signal per output channel, and rising and falling glitches are counted separately.

In the first time interval 501, the received output signal for the first channel contains three falling high-frequency pulses and two rising high-frequency pulses, and the received output signal for the second channel contains two falling high-frequency pulses and one rising high-frequency pulse. The difference is thus in each case equal to one.

In the second time interval 502, the received output signal for the first channel likewise contains three falling high-frequency pulses and two rising high-frequency pulses, and the received output signal for the second channel likewise contains two falling high-frequency pulses and one rising high-frequency pulse. The difference is thus still equal to one in each case.

In the third time interval 503, the received output signal for the first channel contains only two falling high-frequency pulses and one rising high-frequency pulse due to the high temperature, and the received output signal for the second channel contains one falling high-frequency pulse and no rising high-frequency pulse. The difference is thus still equal to one in each case and therefore the fault detection circuit 213 does not indicate a pin fault, although the numbers of pulses have changed due to the change in temperature because they have changed to the same extent for the two channels.

Table 1 gives examples of how pin errors or changes in the ambient conditions affect the difference between the numbers of the high-frequency pulses of the two output channels.

TABLE 1

|  | Difference in the numbers of pulses that occur | Difference in the numbers of rising pulses |
|---|---|---|
| Interruption of the connection of channel 1 (capacitance −50 pF) | +1 | +1 |
| Increase in the line impedance of channel 1 by 100Ω | +2 | +2 |
| Short-circuit of the pin of the first channel to be too high a supply potential with 200Ω | −1 | +1 |
| Short-circuit of the pin of the first channel to a low supply potential with 200Ω | +2 | −1 |

TABLE 1-continued

|  | Difference in the numbers of pulses that occur | Difference in the numbers of rising pulses |
|---|---|---|
| Temperature variation from −40° C. to 175° C. | 0 | 0 |
| Voltage supply variation from 4.5 V to 5.5 V | 0 | 0 |

Pin errors can thus be identified on the basis of the change in the differences, while changes in the environmental variations do not lead to false reports.

Figure 6:
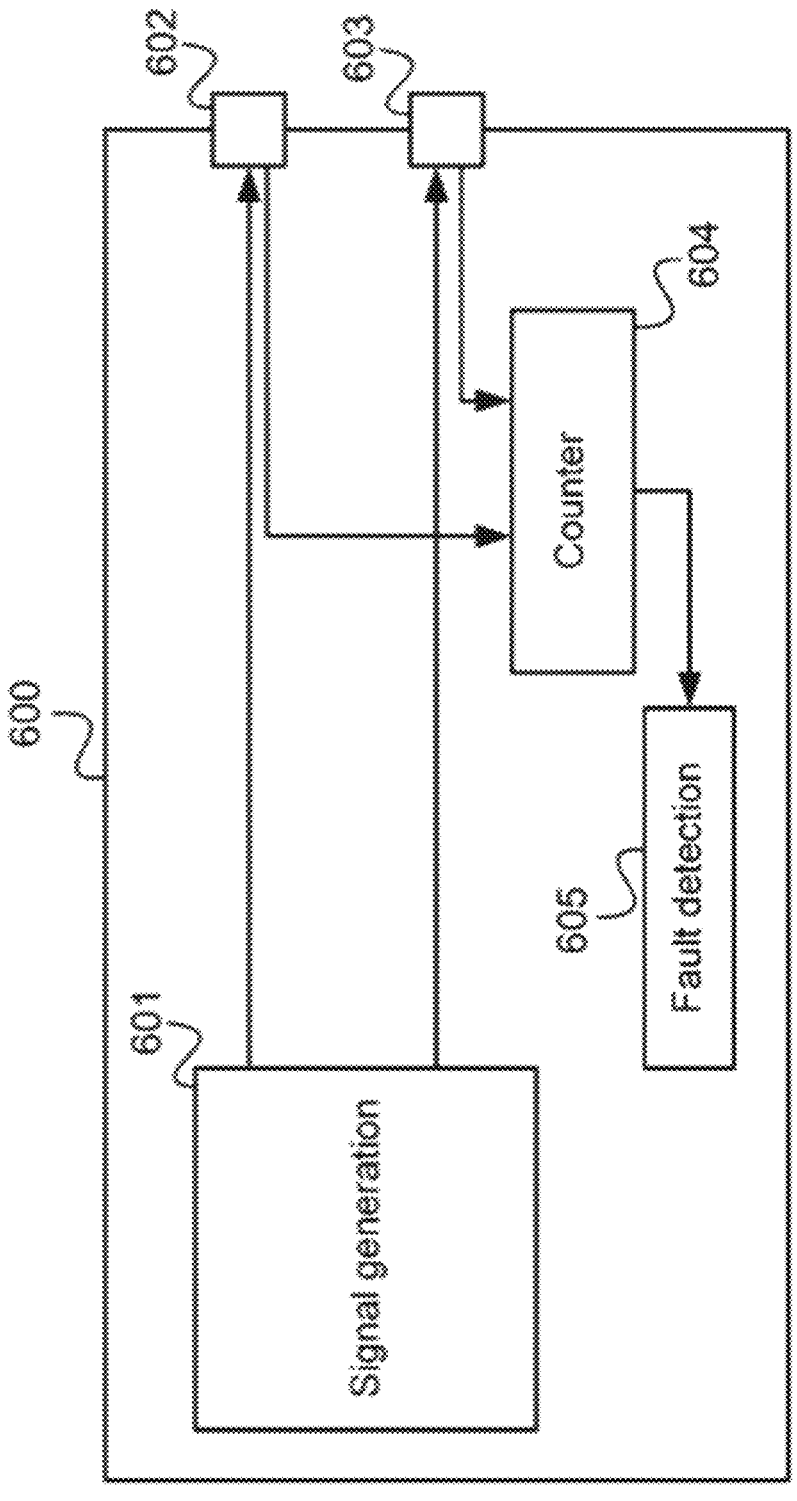
FIG. 6 shows an electronic device according to one embodiment.

In summary, according to various embodiments, provision is made for a memory readout circuit as illustrated in FIG. 6.

FIG. 6 shows an electronic device 600 according to an embodiment.

The electronic device 600 has a signal generation circuit 601, which is configured to generate a first output signal by adding a pulse signal to a first useful signal and supply it to a first output terminal 602 of the electronic device 600, and generate a second output signal by adding the pulse signal to a second useful signal and supply it to a second output terminal 603 of the electronic device 600.

The electronic device 600 further includes a counter circuit 604 configured to receive the first output signal from the first output terminal 602, detect first pulses in the received first output signal and determine a number of the detected first pulses and receive the second output signal from the second output terminal 603, detect second pulses in the received second output signal, and determine a number of the detected second pulses.

The electronic device further includes a fault detection circuit 605 configured to register (and determine) a first difference between the number of first pulses detected in a first time interval and the number of second pulses detected in the first time interval, determine a second difference between the number of first pulses detected in a second time interval and the number of second pulses detected in the second time interval, and indicate an error if the first difference and the second difference differ from one another by at least one predefined threshold value.

In response to the indication of the fault, fault handling can be started (e.g. by a further circuit of the electronic device). For example, the electronic device may be placed in a safe mode or output a signal that triggers a safe mode of a system (e.g., a vehicle) in which it is included. The useful signals are, for example, digital pulse signals.

In other words, according to various embodiments, a (high-frequency or out-of-band) signal is injected into an original (low-frequency) signal. This can take place within time periods (e.g. signal cycles) in the useful mode (mission mode). Interference in the function can be avoided in this case by virtue of the injected signal being filtered out, for example, by means of an external RC filter or a chip-internal glitch filter. The injection (and fault detection) can also take place only once in a fault-tolerant interval: In the mission mode, in one embodiment, the PWM duration (i.e., PWM pulse length) is about ~10 us, and the fault tolerant interval is typically in the range of 10 ms-150 ms. That is to say that the high-frequency pulse can be added to each PWM pulse, or else for example only to every thousands of PWM pulses.

Alternatively, the injection (and fault detection) can be carried out in a test mode, for example after each switch-on (power-up) or a periodic test interval.

The error detection is effected by a cross-comparison of the rising and/or falling pulses between two or more output channels. Since the outputs (e.g. GPIOs (general purpose input outputs) have a similar temperature dependence and supply voltage dependence, any change in the difference in the numbers of detected pulses can be interpreted as an error.

For the fault detection, the output signals are fed back to the fault detection circuit (feedback). However, the feedback takes place (in contrast to the example of FIG. 1, upstream of the output terminals (for example pins), that is to say the feedback lines are connected to the output paths upstream of the output terminals.

It should be noted that the evaluation does not have to take place immediately, but can also take place only later. For example, the first difference and the second difference may be a certain time (one day, months, or even a year) apart and, for example, the first difference may be stored in a flash memory of a microcontroller and regularly compared to a respective second difference.

It should also be noted that, in the case of a very fine resolution of the high-frequency pulse signal, it may happen that the first difference and the second difference differ from one another in a small number of pulses, but this is tolerable. In this case, the predefined threshold value can be set to a tolerable number difference. Only if the deviation of the differences reaches (or exceeds) this limit is an error displayed. If there is no tolerance, the predefined threshold value (that is to say the tolerance limit) can also be set to one (that is to say an error is indicated as soon as the differences differ from one another by at least one pulse, that is to say as soon as they are not identical).

According to various embodiments, a method is performed (e.g. from a device with an electronic device), as shown in FIG. 7.

FIG. 7 shows a flowchart 700 illustrating a method of detecting faults at output terminals of an electronic device.

In 701, a first output signal is generated by adding a pulse signal to a first useful signal.

In 702, the first output signal is supplied to a first output terminal of the electronic device.

In 703, the first output signal is received from the first output terminal (e.g. within the electronic device, i.e. it is fed back).

In 704, first pulses are detected in the received first output signal.

In 705, a number of the detected first pulses is determined (in each case in a first time interval and a second time interval).

In 706, a second output signal is generated by adding a pulse signal to a second useful signal.

In 707, the second output signal is supplied to a second output terminal of the electronic device.

In 708, the second output signal is received from the second output terminal (e.g. within the electronic device, i.e. it is fed back).

In 709, second pulses are detected in the received second output signal.

In 710, a number of the detected second pulses is ascertained (in each case in the first time interval and the second time interval).

In 711, a first difference between the number of first pulses detected in a first time interval and the number of second pulses detected in the first time interval is registered.

In 712, a second difference between the number of first pulses detected in a second time interval and the number of second pulses detected in the second time interval is determined.

In 713, an error is indicated (that is to say for example detection signal which indicates an error is output) if the first difference and the second difference differ from one another by at least one predefined threshold value.

It should be noted that the method steps need not necessarily be carried out in the sequence shown. For example, the first pulses and the second pulses are detected simultaneously in a respective time interval.

Various exemplary embodiments are specified below.

Exemplary embodiment 1 is an integrated circuit as described with reference to FIG. 6.

Exemplary embodiment 2 is an electronic device according to exemplary embodiment 1, wherein the first pulses and the second pulses are pulses which have been injected into the first output signal or into the second output signal by the addition of the pulse signal to the first useful signal or the second useful signal.

Exemplary embodiment 3 is an electronic device according to exemplary embodiment 1 or 2, wherein the first pulses are level dips of one or more pulses of the first useful signal, and wherein the second pulses are level dips of one or more pulses of the second useful signal Exemplary embodiment 4 is an electronic device according to exemplary embodiment 3, wherein the counter circuit is furthermore configured to detect third pulses in the received first output signal and to determine a number of the detected first pulses, wherein the third pulses are level deflections outside pulses of the first useful signal and to detect fourth pulses in the received first output signal and to determine a number of the detected first pulses, wherein the fourth pulses are level deflections outside pulses of the second useful signal, register a third difference between the number of third pulses detected in the first time interval and the number of fourth pulses detected in the first time interval, determine a fourth difference between the number of third pulses detected in the second time interval and the number of fourth pulses detected in the second time interval, indicate an error if the third difference and the fourth difference differ from one another by at least one predefined threshold value.

Exemplary embodiment 5 is an electronic device according to exemplary embodiment 1 or 2, wherein the first pulses are level deflections outside pulses of the first useful signal and the second pulses are level deflections outside pulses of the second useful signal.

Exemplary embodiment 6 is an electronic device according to one of exemplary embodiments 1 to 5, wherein the second time interval follows the first time interval.

Example 7 is an electronic device according to any one of example embodiments 1 to 6, wherein the first output terminal is a first output port of the electronic device and the second output terminal is a second output port of the electronic device.

Exemplary embodiment 8 is an electronic device according to one of exemplary embodiments 1 to 7, wherein the first useful signal and the second useful signal are control signals for controlling another electronic device.

Exemplary embodiment 9 is an electronic device according to exemplary embodiment 8, wherein the first useful signal and the second useful signal are pulse width modulation signals for the other electronic device.

Exemplary embodiment 10 is an electronic device according to one of exemplary embodiments 1 to 9, wherein the first useful signal and the second useful signal are bus signals for communication with another electronic device.

Exemplary embodiment 11 is an electronic device according to one of exemplary embodiments 1 to 10, wherein the first useful signal is a signal of a first output channel of the electronic device and the second useful signal is a signal of a second output channel of the electronic device.

Exemplary embodiment 12 is an electronic device according to exemplary embodiment 11, wherein the output channels are out-channels to the same other electronic device.

Exemplary embodiment 13 is an electronic device according to one of exemplary embodiments 1 to 12, wherein the signal generation circuit is configured to generate a respective output signal for each of two or more output channels of the electronic device by adding a pulse signal to a respective useful signal and to supply it to a respective output terminal, the counter circuit is configured to receive the respective output signal from the respective output terminal, detect respective pulses in the received respective output signal, and determine a number of the detected respective pulses, and the error detection circuit is configured to for each pair of output channels, register a respective first difference between the number of respective pulses detected in a first time interval for the first output channel of the pair and the number of respective pulses detected in the first time interval for the second output channel of the pair, and register a respective second difference between the number of first pulses detected in a second time interval for the first output channel of the pair and the number of second pulses detected in the second time interval for the second output channel of the pair and indicating an error, if, for at least one pair of output channels, the respective first difference and the respective second difference differ from one another by at least one respective predefined threshold value.

Exemplary embodiment 14 is an electronic device according to exemplary embodiment 13, wherein the fault detection circuit is furthermore configured, on the basis of which, for which pairs of out-channels the respective first difference and the respective second difference do not differ from one another by at least the respective predefined threshold value and for which pairs of out-channels the respective first difference and the respective second difference differ from one another by at least the predefined threshold value, for which output channel an error is present.

Exemplary embodiment 15 is an electronic device according to one of exemplary embodiments 1 to 14, wherein the fault is a pin fault.

Exemplary embodiment 16 is an electronic device according to one of exemplary embodiments 1 to 15, wherein the first useful signal and the second useful signal are pulse signals.

Exemplary embodiment 17 is an electronic device according to one of exemplary embodiments 1 to 16, wherein the pulse lengths of the pulse signal are a fraction of the pulse lengths of the first useful signal and of the pulse lengths of the second useful signal.

Exemplary embodiment 18 is an electronic device according to one of exemplary embodiments 1 to 17, wherein the counter circuit is configured to receive the first output signal from the first output terminal via a first filter circuit configured to by adding the pulse signal to the first useful signal, at least partially filter out pulses injected into the first output signal and receive the second output signal from the second output terminal via a second filter circuit configured to by adding the pulse signal to the second useful signal, at least partially filter out pulses injected into the second output signal.

Example embodiment 19 is a method of detecting faults at output terminals of an electronic device as described with reference to FIG. 7.

Although the invention has been shown and described primarily with reference to specific embodiments, it should be understood by those familiar with the technical field that numerous modifications can be made thereto with regard to configuration and details, without departing from the essence and scope of the invention as defined by the claims hereinafter. The scope of the invention is therefore determined by the appended claims, and the intention is for all modifications to be encompassed which come under the literal meaning or the scope of equivalence of the claims.

What is claimed:

1. An electronic device, comprising:
a signal generation circuit configured to generate a first output signal by adding a pulse signal to a first useful signal and to supply the first output signal to a first output terminal of the electronic device, and configured to generate a second output signal by adding the pulse signal to a second useful signal and to supply the second output signal to a second output terminal of the electronic device;
a counter circuit configured to receive the first output signal from the first output terminal, detect first pulses in the received first output signal, and determine a number of the detected first pulses, and configured to receive the second output signal from the second output terminal, detect second pulses in the received second output signal and determine a number of the detected second pulses; and
a detection circuit configured
to register a first difference between the number of first pulses detected in a first time interval and the number of second pulses detected in the first time interval,
to determine a second difference between the number of first pulses detected in a second time interval and the number of second pulses detected in the second time interval, and
to indicate an error when the first difference and the second difference differ from one another by at least one predefined threshold value.

2. The electronic device of claim 1, wherein the first pulses and the second pulses are pulses injected into the first output signal and into the second output signal, respectively, by addition of the pulse signal to the first useful signal and the second useful signal, respectively.

3. The electronic device of claim 1, wherein the first pulses are level dips of one or more pulses of the first output signal, and wherein the second pulses are level dips of one or more pulses of the second output signal.

4. The electronic device as claimed in claim 3, wherein the counter circuit is further configured to detect third pulses in the received first output signal and to determine a number of the detected third pulses, wherein the third pulses are level deflections outside pulses of the first useful signal, and is further configured to detect fourth pulses in the received first output signal and determine a number of the detected fourth pulses, wherein the fourth pulses are level beats outside pulses of the second useful signal; and the detection circuit is configured to
register a third difference between the number of third pulses detected in the first time interval and the number of fourth pulses detected in the first time interval,
determine a fourth difference between the number of third pulses detected in the second time interval and the number of fourth pulses detected in the second time interval, and
indicate an error when the third difference and the fourth difference differ from one another by at least one predefined threshold value.

5. The electronic device of claim 1, wherein the first pulses are out-of-pulses level of the first output signal and the second pulses are out-of-pulses level of the second output signal.

6. The electronic device of claim 1, wherein the second time interval follows the first time interval.

7. The electronic device of claim 1, wherein the first output terminal is a first output port of the electronic device and the second output terminal is a second output port of the electronic device.

8. The electronic device of claim 1, wherein the first useful signal and the second useful signal are control signals for controlling an other electronic device.

9. The electronic device of claim 8, wherein the first output signal and the second output signal are pulse width modulation signals for the other electronic device.

10. The electronic device of claim 1, wherein the first output signal and the second output signal are bus signals for communication with another electronic device.

11. The electronic device of claim 1, wherein the first useful signal is a signal of a first output channel of the electronic device and the second useful signal is a signal of a second output channel of the electronic device.

12. The electronic device of claim 11, wherein the first output channel and the second output channel are out-channels to a single other electronic device.

13. The electronic device of claim 1,
wherein the signal generation circuit is configured to generate a respective output signal for each of two or more output channels of the electronic device by adding a pulse signal to a respective useful signal and to supply the respective output signal to a respective output terminal,
wherein the counter circuit is configured to receive the respective output signal from the respective output terminal, to detect respective pulses in the received respective output signal, and to determine a number of the detected respective pulses, and
wherein the detection circuit is configured for each pair of output channels to
register a respective first difference between the number of respective pulses detected in a first time interval for a first output channel of the pair and the number of respective pulses detected in the first time interval for a second output channel of the pair,
determine a respective second difference between the number of first pulses detected in a second time interval for the first output channel of the pair and the number of second pulses detected in the second time interval for the second output channel of the pair, and
indicate an error when, for at least one pair of output channels, the respective first difference and the respective second difference differ from one another by at least one respective predefined threshold value.

14. The electronic device of claim 13, wherein the detection circuit is further configured, based on for which pairs of out-channels the respective first difference and the respective second difference do not differ from one another by at least the respective predefined threshold value and for which pairs of out-channels the respective first difference and the respective second difference differ from one another by at least the predefined threshold value, for which output channel an error is present.

15. The electronic device of claim 1, wherein the error is a pin fault.

16. The electronic device of claim 1, wherein the first useful signal and the second useful signal are pulse signals.

17. The electronic device of claim 1, wherein pulse lengths of the pulse signal are a fraction of pulse lengths of the first useful signal and pulse lengths of the second useful signal.

18. The electronic device of claim 1, wherein the counter circuit is configured to receive the first output signal from the first output terminal via a first filter circuit configured to add the pulse signal to the first useful signal, at least partially filter out pulses injected into the first output signal and receive the second output signal from the second output terminal via a second filter circuit configured to add the pulse signal to the second useful signal, and at least partially filter out pulses injected into the second output signal.

19. A method for detecting faults at output terminals of an electronic device, comprising:

generating a first output signal by adding a pulse signal to a first useful signal;

supplying the first output signal to a first output terminal of the electronic device;

receiving the first output signal from the first output terminal;

detecting first pulses in the received first output signal;

determining a number of the detected first pulses;

generating a second output signal by adding a pulse signal to a second useful signal;

supplying the second output signal to a second output terminal of the electronic device;

receiving the second output signal from the second output terminal;

detecting second pulses in the received second output signal;

determining a number of the detected second pulses;

registering a first difference between the number of first pulses detected in a first time interval and the number of second pulses detected in the first time interval;

determining a second difference between the number of first pulses detected in a second time interval and the number of second pulses detected in the second time interval; and displaying an error when the first difference and the second difference differ from one another by at least one predefined threshold value.

* * * * *